United States Patent [19]

Bohmer

[11] Patent Number: 5,130,658

[45] Date of Patent: * Jul. 14, 1992

[54] APPARATUS AND METHOD FOR INDICATING STATE OF CHARGE OF A BATTERY

[75] Inventor: William Bohmer, Succasunna, N.J.

[73] Assignee: Display Matrix Corporation, Randolph, N.J.

[*] Notice: The portion of the term of this patent subsequent to Apr. 14, 2009 has been disclaimed.

[21] Appl. No.: 574,661

[22] Filed: Aug. 29, 1990

Related U.S. Application Data

[63] Continuation-in-part of Ser. No. 486,316, Feb. 28, 1990.

[51] Int. Cl.$^5$ .............................................. G01N 27/416
[52] U.S. Cl. ..................................... 324/435; 340/636; 331/113 R
[58] Field of Search ................ 324/435; 340/636, 722; 331/113 R; 307/264; 320/48; 350/332 R

[56] References Cited

U.S. PATENT DOCUMENTS

| | | | |
|---|---|---|---|
| 2,605,455 | 7/1952 | Swartz | 320/4 |
| 3,312,904 | 4/1967 | Sterff et al. | 331/113 R |
| 3,820,875 | 6/1974 | Bohmer | 350/160 LC |
| 3,997,796 | 12/1976 | Sanders et al. | 331/113 R |
| 4,020,243 | 4/1977 | Oldford | 429/93 |
| 4,211,478 | 7/1980 | Huber et al. | 340/636 |
| 4,310,606 | 1/1982 | Maida | 429/93 |
| 4,360,780 | 11/1982 | Skutch, Jr. | 324/437 |
| 4,439,736 | 3/1984 | Schwartz | 324/437 |
| 4,493,531 | 1/1985 | Bohmer et al. | 350/336 |
| 4,514,695 | 4/1985 | Lau | 324/437 |

Primary Examiner—Kenneth A. Wieder
Assistant Examiner—Maura K. Regan

[57] ABSTRACT

A device for indicating the state of charge of an electrochemical cell or battery includes a regulated-voltage generating circuit having an input connectable to the cell and an output providing a regulated reference voltage, an amplifying circuit having an input connectable to the cell and an output having a predetermined relation to a voltage within a predetermined range applied to the input of the amplifying unit, and a solid state analog display unit having a reference input connected to the output of the regulated-voltage generating circuit and an address input connected to the amplifying circuit. The relation between the address voltage output of the amplifying circuit and the cell voltage input is such that the address voltage corresponds to the state of charge of the cell in the predetermined range of cell voltages and falls within the range of the most negative and most positive values of the reference voltage. The device is adaptable for use as an integral state of charge indicator for a battery-operated tool or appliance or as a charge tester for different sizes and types of consumer batteries. One such battery tester has a housing shell provided with a plurality of shaped recesses, each recess receiving a single type or size of battery for test. A number of recesses are aligned so that a single spring-biased metal contact strip can be used for the number of recesses. The spring backing for the contact strip is a resilient pad of plastic foam material.

25 Claims, 7 Drawing Sheets

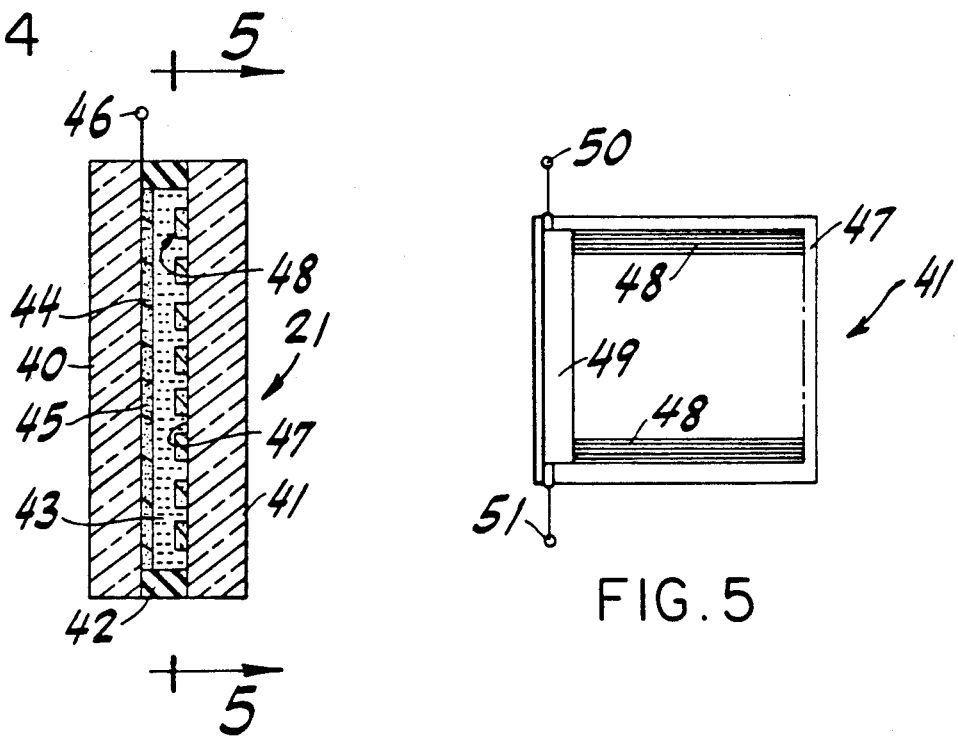
FIG. 4
FIG. 5
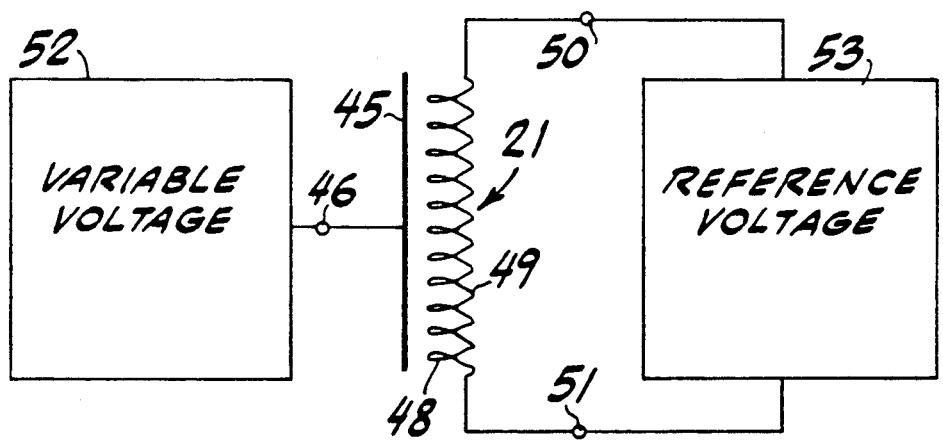
FIG. 6
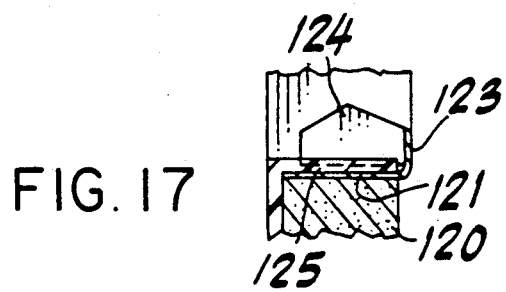
FIG. 17

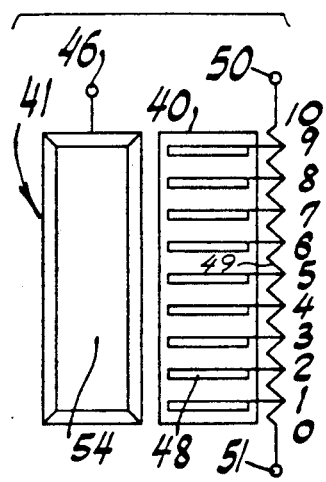 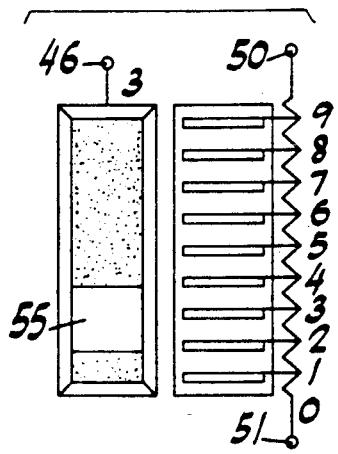 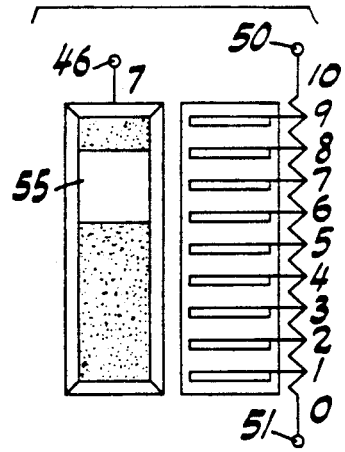
FIG. 7A     FIG. 7B     FIG. 7C
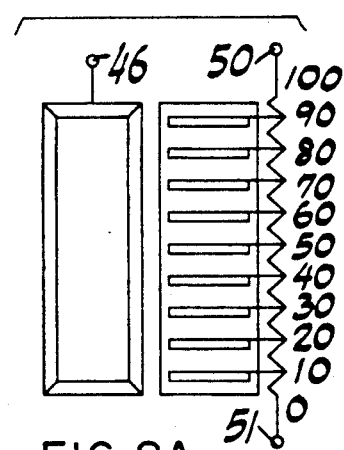 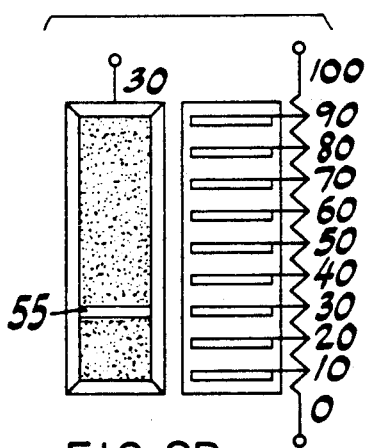 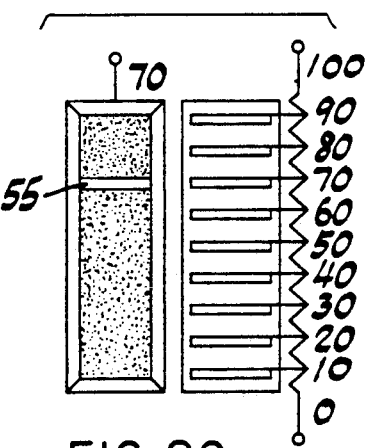
FIG. 8A     FIG. 8B     FIG. 8C
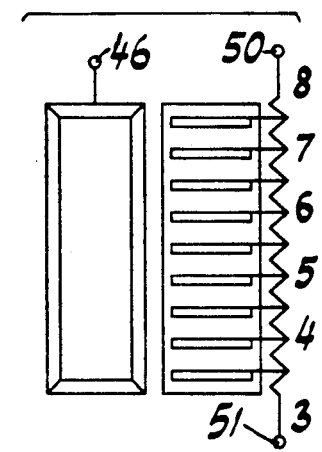 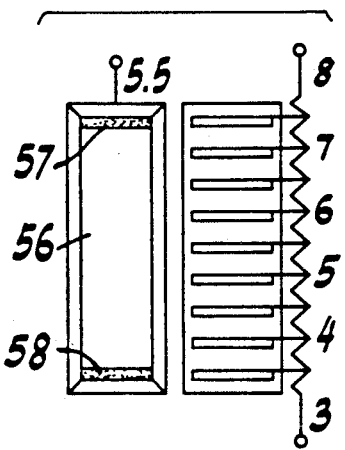 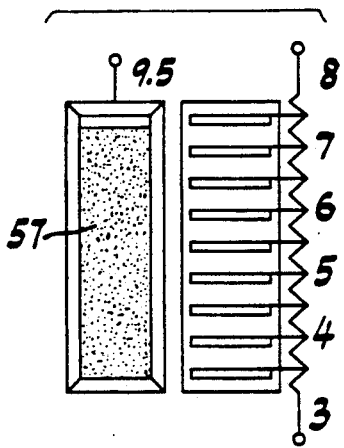
FIG. 9A     FIG. 9B     FIG. 9C

APPARATUS AND METHOD FOR INDICATING STATE OF CHARGE OF A BATTERY

CROSS REFERENCE TO RELATED APPLICATION

This is a continuation-in-part of U.S. patent application Ser. No. 07/486,316 filed on Feb. 28, 1990.

BACKGROUND OF THE INVENTION

1. Field of the Invention

The present invention relates to battery charge indicating devices, and particularly to battery charge indicators adaptable for mounting in a housing of a battery-powered tool or appliance and to testers for common sizes of consumer goods batteries.

2. Description of the Prior Art

The development of electrical implements, such as portable power tools and small appliances, operated by rechargeable batteries has created a need for charge indicators for the batteries that power such tools and appliances. There is also a need for a compact device that is simple to operate for testing the state of charge of any popular size of nonrechargeable battery for consumer goods. Such charge indicators must be durable, relatively accurate, inexpensive, and adaptable to be mounted permanently in or on the housings of the battery-operated tools and appliances or the housing of a battery tester. Another important requirement is that such charge indicators be rugged to withstand the rough handling usually received by tools and small appliances. The measuring circuit of the charge indicators must have low current drain to avoid significant discharge of the battery during measurement of the state of charge of the battery.

Portable battery charge indicating instruments are well known for checking the state of charge of batteries by connecting a pair of leads of such instruments to the terminals of the batteries to be tested. Such instruments typically employ galvanometers with a circuit for loading the battery while the battery is being tested. These instruments are intended for occasional testing; they are inherently fragile and comparatively expensive.

Also known are digital voltmeters having liquid crystal numeric displays. Their analog-to-digital converters and complex digital displays make these voltmeters relatively expensive, and the displays must be large enough for the individual numbers to be easily readable.

Battery charge indicators have been permanently installed in storage cells to indicate the charge level as a function of changes in the specific gravity of the electrolyte. Such specific gravity indicators are used primarily with lead-acid cells; they are unsuitable for batteries having a gel or solid electrolyte, such as the commonly-used rechargeable nickel-cadmium batteries.

The applicant's U.S. Pat. No. 3,820,875, which issued on Jun. 28, 1974, discloses a scanner device having a field effect light scattering dielectric (e.g., a liquid crystal material) disposed between a pair of plates. The inner surface of one of the plates carries a resistor of predetermined length and configuration; the inner surface of the other plate carries a substantially nonresistive conductor, facing the resistor. This conductor is also called an address plate. At least one of the one plate and resistor and the other plate and conductor are transparent, so that the dielectric is visible through at least one of the plates.

A first voltage difference applied to the ends of the resistor produces a voltage gradient along the length of the resistor. Selective adjustment of a second, variable, voltage applied to the address plate changes the location on the one plate where the gradient voltage equals the address plate voltage to render the dielectric in that region visually distinguishable from the dielectric in the rest of the space between the plates.

In a three-plate embodiment, a first resistor extends along an edge of a first plate, and a second resistor extends perpendicularly to the first resistor along an adjacent edge of the plate. Parallel nonresistive conductor strips extend from each resistor perpendicularly across the opposite faces of the plate to form a grid, with parallel strips in one direction on one face of the plate and parallel strips in a perpendicular direction on the other face of the plate. The first plate is sandwiched between second and third plates, spaced from the respective faces of the first plate and each having a nonresistive conductor (address plate) on the inner surface facing the respective series of parallel conductor strips. The spaces between the plates are filled with a field-effect light scattering dielectric.

A voltage difference impressed on the ends of either resistor and an intermediate voltage applied to the facing address plate produce a linearly extending visually distinguishable region in the dielectric between them at a location where the potential of a conductor strip equals the voltage applied to the facing address plate. If the dielectric is a liquid crystal, the visually distinguishable region normally is a transparent region. Since the transparent lines formed in the dielectrics on the opposite sides of the one plate are perpendicular to each other, only their intersection is transparent to light passing through both dielectrics. Thus a window is created at the intersection that appears as a visually distinguishable spot. When varying voltages are applied to the conductors on the second and third plates, the spot can be selectively scanned over the display.

U.S. Pat. No. 4,493,531 of BOHMER et al., issued on Jan. 15, 1985, introduces several alternative embodiments of the field-sensitive optical display devices described above that can produce various patterns such as a movable dot, intersecting lines, and a pivoting line. Although the display devices of these patents are sturdy and inexpensive, they are not directly usable as battery charge indicators.

SUMMARY OF THE INVENTION

It is therefore an object of the invention to provide an apparatus and method for deriving a signal as a function of the state of charge of an electrochemical cell or battery and to drive an analog solid state indicating display by such signal.

Another object of the invention is to provide an apparatus for indicating the state of charge of a battery that is powered by the battery being checked.

It is another object of the invention to utilize an analog liquid crystal display to indicate the state of charge of a battery to which the display is connected.

It is a further object of the invention to dispose a circuit for driving an analog liquid crystal display of the state of charge of a battery and the analog liquid display itself within the housing of a device which contains the battery.

It is an additional object of the invention to indicate the state of charge of a battery by an analog liquid crystal display when the battery is under load.

It is also an object of the invention to utilize an analog liquid crystal display to indicate both the state of charge of a battery and the rate of change of the state of charge of the battery.

Another object of the invention is to provide an inexpensive, easy-to-use battery tester that can test all usual types and sizes of nonrechargeable batteries for consumer devices.

Still another object of the invention is to provide a small and inexpensive battery tester having an analog display that is powered by the battery being tested.

These and other objects are achieved by a method and apparatus for indicating the state of charge of a battery that comprise respective steps of and means for amplifying the output of the battery of which the charge is to be indicated while the battery is under load, subjecting the range of amplified outputs from a fully discharged to a fully charged condition of the battery to a predetermined electrical function, and applying the output subjected to the predetermined electrical function to a liquid crystal display device to which is applied a reference voltage derived from the battery and in which the size, extent, or position of the display portion indicates the charge level or the state of charge of the battery.

The apparatus of the invention may comprise both a display of the state of charge and a display of the rate of change of the state of charge of a battery under load.

BRIEF DESCRIPTION OF THE DRAWINGS

For a complete understanding of the invention, reference should be made to the following detailed description in connection with the accompanying drawings, in which:

FIG. 4 is a section view of a liquid crystal unit usable as the display element for a battery charge indicating device according to the invention;

FIG. 5 is face view of a reference electrode plate of the liquid crystal unit, taken along line 5—5 of FIG. 4,;

FIG. 6 is a simplified schematic and block diagram illustrating the electrical arrangement of a battery indicating device according to the invention;

FIGS. 7A, B, and C are schematic views of a liquid crystal unit illustrating changes in the display as a function of changes in variable voltage applied to an address plate of a liquid crystal unit with a given potential difference applied to the reference electrode plate;

FIGS. 8A, B, and C are schematic views similar to FIGS. 7A, B, and C illustrating the effect on display resolution of increasing the potential difference applied to the reference electrode plate;

FIG. 17 is a section view of a portion of the top shell half taken along line 17—17 in FIG. 16.

DESCRIPTION OF THE PREFERRED EMBODIMENTS

Figure 1:
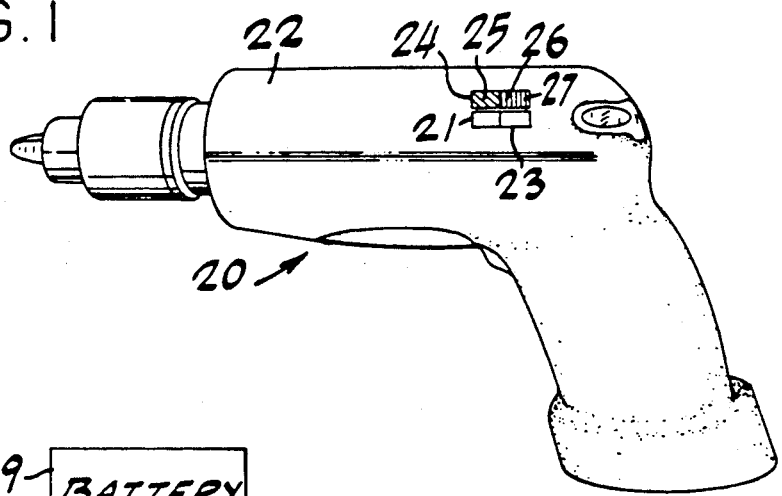
FIG. 1 is a perspective view of a battery-powered tool having an analog solid state indicating display of the state of battery charge mounted in the tool housing.

In the following description, the same element or a similar element is identified by the same reference numeral in the different figures. In addition, although the term "cell" properly refers to a single electrochemical cell and the term "battery" properly refers to a plurality of cells, usually in a single case, it is common to use the two terms interchangeably, and they are so used in this specification and the appended claims.

FIG. 1 illustrates a battery-powered implement, in this case a power drill or screwdriver 20, having a solid state analog display unit 21 mounted in the top of the housing 22 for showing the state of charge of the battery. The display unit is in the form of an elongated rectangle, and the display consists of a visually distinguishable portion 23 that expands to fill the rectangle when the battery is fully charged and contracts as the battery discharges, so that the display is essentially a "bar graph" of the state of charge. A label 24 next to the display translates the bar graph height into state of charge information. In the illustrated version, the label is divided into three different colored sections, a green section 25 indicating sufficient charge for normal use, a yellow section 26 indicating only a short period of use is still available, and a red section 27 indicating that the battery should be recharged.

Figure 2:
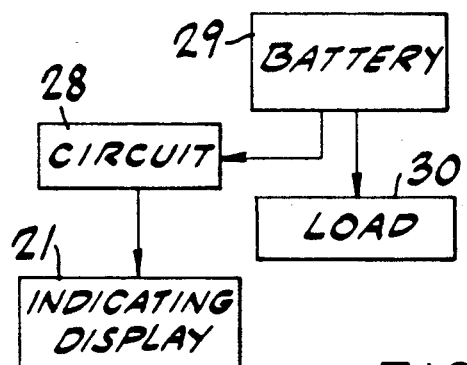
FIG. 2 is a simplified block diagram of a battery-operated system including the charge indicating device of the invention.

As shown in FIG. 2, the indicating display unit 21 is driven by a circuit 28 that is powered by a battery 29 that also supplies power to a load 30, such as the drill in FIG. 1. The construction and operation of preferred embodiments of the indicating display unit 21 and the circuit 28 will be described in detail below.

To design a charge indicating device it is necessary to know the type and voltage range of the batteries it will be used with. Heavy-duty portable industrial tools may have a rechargeable lead-acid battery as a power source; whereas most lighter weight professional and consumer implements are powered by rechargeable nickel-cadmium batteries. Each of these battery types has a unique discharge curve (voltage versus time at a constant current load). A lead-acid cell has a substantially linear discharge curve up to a final steep drop-off. To accurately indicate the state of charge of a lead-acid cell, it is merely necessary to track the linear voltage curve along the entire operating range, or at least to the downturn near the end of discharge, and to present it to the analog display after scaling and amplification through appropriate circuitry. In many cases circuitry is not required, and the display can be driven directly from the battery.

Figure 3:
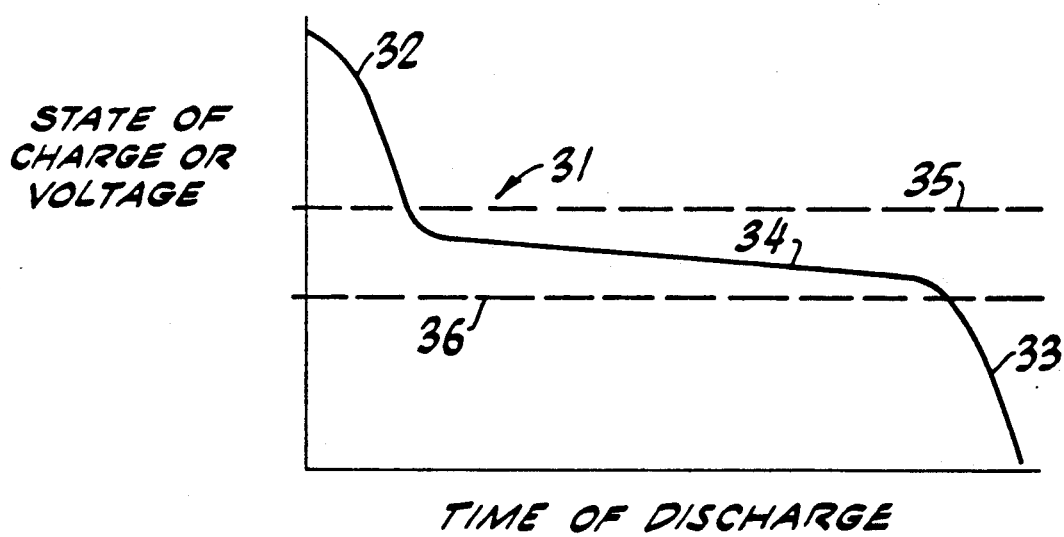
FIG. 3 is a typical discharge curve of a nickel-cadmium battery.

By contrast, as shown in FIG. 3, the discharge curve 31 of a nickel-battery has two steep portions. The first portion 32 is at the higher, fully-charged end, and the other portion 33 is at the lower, nearly-discharged end. The operating range of the battery lies in the essentially flat mid-portion 34 located between upper and lower dashed lines 35 and 36, respectively, which are separated by only a few hundred millivolts. To indicate the state of charge of this type of battery it is necessary to provide a circuit that ignores both the initial and final steep portions of the curve and expands the slope of the so-called flat operating section 34 and presents it to the analog display in a linear manner.

The design also depends on the characteristics of the analog display unit which will be driven by the circuit of the device. If, for example, the analog display requires a relatively high voltage for operation and the battery is a low voltage type, the circuit must include a voltage step-up or amplifying section. In addition, analog displays typically require a calibration or reference voltage, which may desirably be supplied by a voltage regulation circuit.

FIGS. 4 through 9 present the constructional features and operating characteristics of one type of analog display unit based on the scanner devices of the previously discussed BOHMER patent. With reference to FIG. 4, an indicating display unit 21 includes first and second plates 40 and 41 that are maintained in closely spaced apart relation by a peripheral sealing member 42. The space between the plates contains a liquid crystal material 43.

Disposed on the inner surface 44 of the first plate 40 is an address electrode 45 in the form a substantially non-resistive sheet disposed over an area of the plate in which it is desired to vary the optical appearance of the display. In the present example, the address electrode has a rectangular shape for creating an analog bar graph representation. The address plate has a single terminal 46 for connecting the plate to a variable voltage source, which in the case of the present invention would be a source representing the state of charge of a battery.

The inner surface of the second plate 41 carries a series of parallel spaced conductor strips 48. As shown in FIG. 5, these conductor strips 48 are connected at intervals along the length of a resistor 49 that is disposed at an edge of the second plate 41 perpendicular to the conductor strips 48. The number of conductor strips is selected according to the resolution desired for the resulting bar graph display. First and second terminals 50 and 51 at opposite ends of the resistor provide for connecting the resistor across a source of potential difference.

Either one or both of the plates 40 and 41 must be transparent to permit the liquid crystal material to be visible. If the first plate 40 is on the viewing side, the non-resistive address electrode sheet must also be a transparent material, such as a layer of indium-tin oxide. The same is true for the conductor strips 48 if the second plate 41 is on the viewing side, or if the display is to be back-lit. If the conductor strips are narrow relative to their spacing, it may desirable that they not be transparent, so that they will provide an inherent voltage scale directly on the display. Alternatively, the plate on the non-viewing side may be reflective, if the dielectric material is to be viewed under ambient light conditions or is itself electro-luminescent.

Although the space between the plates is filled with a liquid crystal material in the illustrative example, any field-effect light scattering or light emitting dielectric can be used that exhibits a visual change in response to an electrostatic or electromagnetic field. The physical behavior and resulting changes in appearance of these materials under the influence of such fields are well known and need not be discussed in detail here.

FIG. 6 shows in schematic form an analog display unit of the type illustrated by FIGS. 4 and 5, with the terminal 46 of the address electrode 45 connected to a variable voltage source 52 and the first and second terminals 50 and 51 of resistor 49 connected across a reference voltage source 53. The reference source 53 produces a voltage gradient between the ends of resistor 49, so that each of the conductor strips 48 connected at intervals along the length of the resistor has an incrementally different potential from that of the strip on either side. The visual effects resulting from various combinations of variable voltage and reference voltage are discussed in connection with FIGS. 7, 8, and 9, each of which shows several identical indicating display units 21 in schematic form with the first and second plates side-by-side, instead of superposed, for easier understanding of the relation between the applied voltages and the resulting visual displays.

With reference first to FIG. 7A, a reference potential of 10 voltage units is applied across resistor terminals 50 and 51, with no voltage on address terminal 46. The voltage gradient distributed to the conductor strips 48 is shown along the length of resistor 49. With no potential difference applied across the gap between the address electrode 45 and the conductor strips, the display window 54 of the first plate 40 is clear. In FIG. 7B a potential of three voltage units is applied to address terminal 46, which causes the liquid crystal between the plates 40 and 41 to "turn on" except for the region where the voltage difference between the address plate and individual conductor strips is less than the actuating potential of the liquid crystal. The resulting display shows a clear bar 55 centered at the location of the "three volt" conductor strip, with the rest of the display window being dark. In FIG. 7C the potential applied to address terminal 46 is changed to seven voltage units, which causes the bar 55 to move to the seven volt location along the resistor 49. Thus, the location of the bar is changed by simply changing the voltage at terminal 46.

The width of the bar 55 at the equal voltage location along the resistor is a function of the potential difference applied to the resistor terminals 50 and 51, the physical length of the resistor, and the operating voltage of the liquid crystal material, which is typically in the range from zero to two or three volts. In FIGS. 8A–8C the potential difference applied to the resistor terminals is changed from 10 to 100 voltage units. The figures show the resulting visual effect with voltages applied to the address terminal 47 of zero, thirty and seventy units, respectively. With no voltage on the address plate, the display window is clear, as before, but the width of the bar 55 in FIGS. 8B and 8C is reduced by a factor of ten compared with FIGS. 7B and 7C where the potential difference applied to the resistor terminals was only ten voltage units.

Figure 9D:
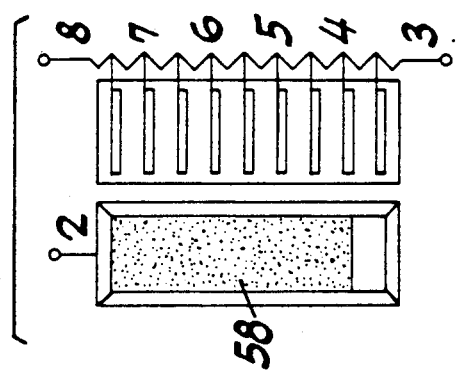
FIGS. 9A, B, C, and D are schematic views similar to FIGS. 7 and 8 illustrating the effect of decreasing the potential difference applied to the reference electrode plate to a small multiple of the actuating voltage of the liquid crystal unit.

FIGS. 9A-D illustrate a novel variation in the potential difference applied to the terminals of resistor 49. The difference is reduced to five volts, but the lowest value is three and the highest value is eight. In FIG. 9A, with no voltage applied to address terminal 46, the display window 54 is clear, as before. When five and a half volts are applied to the address terminal (FIG. 9B), a clear region 56 remains centered in the display window, the vertical extent of the region corresponding to approximately four volts, assuming a liquid crystal operating potential of about two volts. Thus, there are small dark regions 57 and 58 at the top and bottom of the display, respectively. These act like two edge type bar graphs, the dark region 57 moving up from the bottom of the display with increasing voltage applied to the address terminal, and the dark region 58 moving down from the top of the display with decreasing voltage applied to the address terminal. For example, FIG. 9C shows the effect when the variable voltage is increased by four volts to nine and a half volts. Although the highest voltage applied to the resistor 49 is only eight volts, the assumed two-volt operating sensitivity of the dielectric material results in the upper edge of the activated portion 57 rising only to the 7.5 volt location on the resistor. Similarly, a reduction in the voltage applied to the address terminal to two volts, as shown in FIG. 9D, causes the lower edge of the activated portion 58 to extend down to the 4 volt location on the resistor. In this example, therefore, it is clear that increasing the variable voltage to ten volts or above will raise the lower bar graph to fill the window, and reducing the variable voltage to one volt or below will similarly lower the upper bar graph to cover the window. Thus, the arrangement illustrated by FIGS. 9A-D provides a theoretical range equal to the potential difference applied to the resistor (e.g., five volts) plus twice the operating voltage of the dielectric material (e.g., twice two volts).

It will be apparent from the above discussion that by tailoring the upper and lower voltages applied to the resistor terminals and by suitably amplifying the operating voltage range, the indicating display unit 21 can be adapted to provide a bar graph presentation of just the middle operating range of a nickel-cadmium battery, with the steep end portions being off-scale. A drawback accompanying a low fixed potential difference across the resistor, however, is that resolution is significantly impaired because the visible change in the dielectric material occurs gradually up to a maximum as the voltage difference between the address electrode and the conductor strips increases from the equal voltage location up to the nominal operating voltage of the material.

Figure 10:
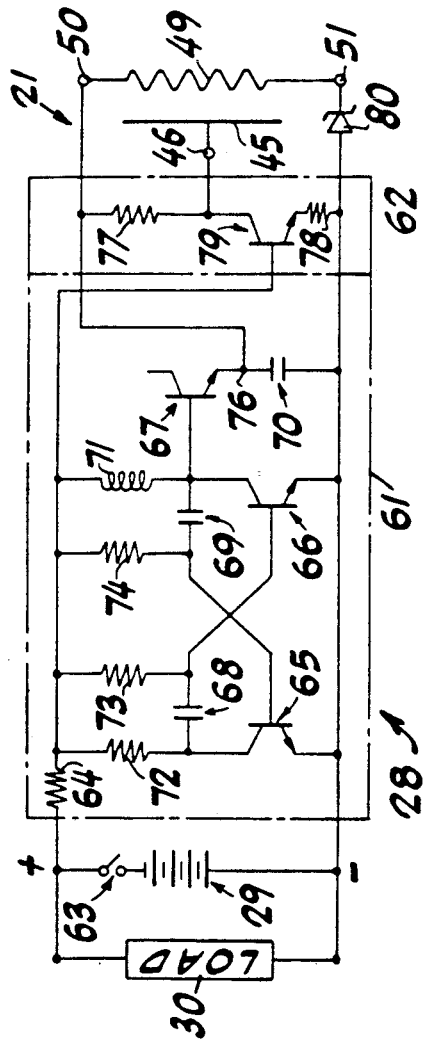
FIG. 10 is an electrical schematic diagram of a battery-operated circuit for the charge indicator device of the invention.

FIG. 10 shows a schematic diagram of a circuit 28 that is suitable for driving an analog display unit 21 to indicate the state of charge of a battery 29 when the battery is connected to a load 30. In particular, the circuit will produce a bar graph type of display on a unit of the type of FIGS. 4 and 5 installed in a nickel-cadmium battery-powered implement such as the drill of FIG. 1.

The circuit 28 of FIG. 10 has a reference-voltage generating section 61 and a battery voltage amplifying section 62. The battery is simultaneously connected to the circuit and the load by closing switch 63, so that the circuit does not drain the battery when the implement is not in operation. This also prevents the indicating display unit from giving a false reading, since it is calibrated to show the state of charge of the battery under load, when the battery voltage is lower than in the no-load condition.

When switch 63 is closed, the voltage across resistor 64 is a function of the voltage of the battery when the battery is delivering current to the load 30. Transistors 65, 66, and 67, coupling capacitors 68 and 69, storage capacitor 70, inductance 71, and resistors 72, 73, and 74 comprise a regulated oscillator step-up power supply 61. This portion of circuit 28 is a variation of a standard multivibrator, with the inductance 71 replacing a resistor normally found in the collector leg of transistor 66. A square-wave frequency determined by appropriate selection of values for resistors 72, 73, and 74, capacitors 68 and 69, and inductance 71 is generated at the collectors of transistors 65 and 66. When transistor 66 is shut off during each alternate cycle, the magnetic field in inductance 71 collapses, creating a flyback high voltage spike at the collector of transistor 66 which is directed to storage capacitor 70 through transistor 67.

Transistor 67 has two functions. The first is to act as a diode when transistor 66 is shut off, to allow the flyback high voltage spike to charge up the capacitor 70. The second function is to act as a voltage regulator when transistor 66 is conducting, to hold the charge at a constant high value determined by the zener diode effect of transistor 67. Transistor 67 can be replaced by a regular zener diode, with the base and emitter connections to the transistor being applied, respectively, to the anode and cathode of the zener diode. The junction 76 between the emitter of transistor 67 and storage capacitor 70 thus becomes a source of regulated voltage which is connected to the first terminal 50 of resistor 49 of the indicating display unit, with the other side of the storage capacitor 70 being connected through a zener diode 80 to the second terminal 51 of resistor 49. The level of the thus regulated reference voltage is determined by selecting the transistor 67 for a desired zener diode voltage and is usually much higher than the input voltage presented at resistor 72. The zener diode 80 provides an offset voltage at terminal 51 so that the full scale range of the display will correspond to the linear range 34 of the state of charge voltage curve shown in FIG. 3.

The regulated reference voltage is also fed to the amplifier section 62, which is composed of resistor 77, resistor 78, and transistor 79. The output of the amplifier is applied to the address terminal 46 of the liquid crystal display unit. The amplification factor of the amplifier section 62 is selected to create a cursor type bar graph display on the liquid crystal unit, similar to that of the high voltage example of FIG. 8, indicative of the input voltage developed at resistor 64 and applied to the base of transistor 79.

The regulated step-up power supply section 61 provides a relatively high voltage with minimal current drain. The high impedance analog liquid crystal display 21 operates well with very low currents. The display will operate in the D.C. mode without any appreciable plating within the display due to the very low current passing through the liquid crystal and also because the display is actuated only when the load is applied to the battery.

The circuit of FIG. 10 drives a single channel display unit 21 to indicate the charge level of the battery 29. There can be situations when the charge level will change rapidly, and if the display is not observed continuously, an incorrect interpretation could result. A variation of the circuit and display of FIG. 10 provides a means to display the rate of discharge as well as the charge (or discharge) level.

Figure 11:
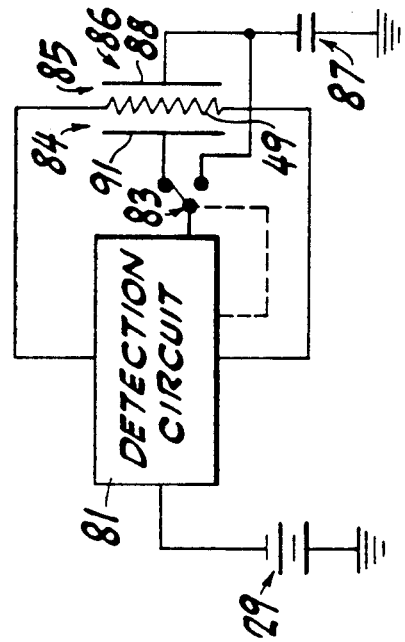
FIG. 11 is a block diagram of an alternative embodiment of the invention employing a dual liquid crystal unit for indicating both the state of charge and the rate of change of the state of charge of a battery.

In the block diagram of FIG. 11, detection circuit 81, which corresponds to circuit 28 of FIG. 10, has an output connected to the common terminal of a switch 83. The switch can connect to either channel 84 or channel 85 of a two-channel analog display unit 86. The rate at which switch 83 shifts between channels is determined by components in the detection circuit 81. A storage capacitor 87 is connected to the address electrode 88 of channel 85 to provide an inexpensive sample and hold circuit.

The detection circuit senses the voltage level of the rechargeable battery 29 as described previously. The output is now directed alternately to the two-channels of display unit 86 through the switch 83 at time intervals sufficient to show separate voltages if the levels have changed during the interval. It is necessary to store at least one of the samples in the storage capacitor 87 in order to view one time period in memory.

If the battery 29 has been fully charged, the rate at which the voltage drops is very slow, producing an insignificant difference in two successive measurements separated by the preselected fixed time interval. The two-channel display unit will have two bar graphs 89 and 90 (see FIGS. 12A-C) side by side, and as shown in FIG. 12A, the bars will appear to be at almost the same level, with the second bar 90 representing the stored voltage level applied to address electrode 88 of the second channel 85 and the first bar 89 representing the current instantaneous level as applied to address electrode 91 of the first channel 84.

When the dual bar graphs 89 and 90 are nearly at equal levels the charge level of the battery is stable. If the battery is not fully charged, the rate at which the voltage drops under load is somewhat faster, producing a more significant difference in two successive measurements separated by the fixed time interval. FIG. 12B shows the dual bar graph display in this situation. The bars now appear at different levels, with the most recent voltage shown on bar 89 significantly lower than the stored voltage level on bar 90. When the dual bar graphs are separated by a significant difference as in FIG. 12B, it is an indication that the overall reading of capacity is changing and should be observed more frequently.

Figures 12A, 12B, 12C:
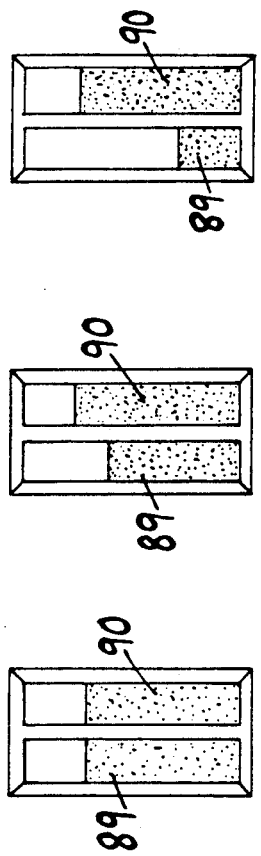
FIGS. 12A, B and C show three different display indications of the dual liquid crystal unit of FIG. 11 for three different conditions of charge, respectively.

If the battery has had only a brief recharge, then the rate at which the voltage drops is extremely fast, producing a major difference between two measurements that are separated by the fixed time interval and resulting in a reading as shown in FIG. 12C. This is an indication that the overall reading is changing rapidly and only a small surface charge exists in the battery.

The display shown in FIGS. 12A-C includes only two channels 84 and 85 and one storage capacitor 87, but additional channels with additional storage capacitors can be incorporated. The positions of bar graphs 89 and 90 can be reversed, as well, so that the left hand bar denotes the stored value and the right hand bar denotes the current voltage level.

The circuit of FIG. 10 is arranged to indicate the state of charge of a single battery while subjected to an external load that draws current from the battery. With minor changes, this circuit is equally well adapted to indicate the state of charge of any one of several different types of batteries under no-load conditions.

Figure 13:
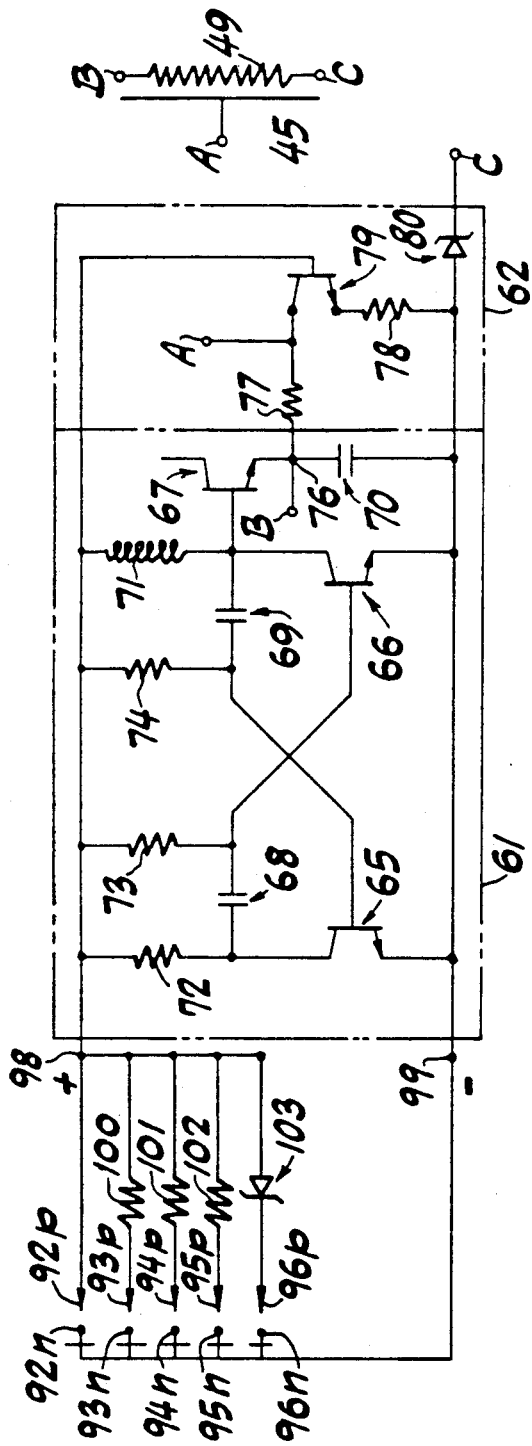
FIG. 13 is a modification of the electrical schematic diagram of FIG. 10 for use in a tester for multiple types of batteries.

FIG. 13 is a modification of the circuit of FIG. 10 that is intended for use in a tester for a number of different types and sizes of batteries, for example, sizes D, C, AA, and AAA 1.5 volt alkaline cells, 1.5 volt button cells, 3 volt lithium cells, and 9 volt batteries. Components in the circuit of FIG. 13 having the same function as in the circuit of FIG. 10 have the same reference numerals. The only differences between the two circuits are at the input end, where the hard-wired battery 29, load 30, switch 63, and voltage dividing resistor 64 have been replaced with a plurality of pairs of battery testing input contacts $92n$, $92p$; $93n$, $93p$; $94n$, $94p$; $95n$, $95p$; and $96n$, $96p$ connected in parallel.

Each pair of input contacts is adapted to engage the positive and negative terminals of a specific size and type of battery and may include an appropriate resistive element for developing an input voltage that falls within a preselected operating range of the indicator circuit. For example, in the application considered here, the reference voltage generating section 61 and the battery voltage amplifying section 62 are designed to provide a minimum reading on the bar graph-type indicator with an input voltage between junctions 98 and 99 of 1.0 volt and a maximum reading on the indicator with an input voltage between these junctions of 1.6 volts. Input contacts $92n$ and $92p$ are adapted to contact the negative and positive terminals of a 1.5 volt button cell. Because of the low current capacity of such a cell, contact $92n$ is connected directly to terminal 98. Input contacts $93n$ and $93p$ are adapted to contact the negative and positive terminals of a 1.5 volt AAA cell. Since this type of cell has a higher current capacity than a button cell (i.e., its output voltage does not drop as much for a given current drain), a resistor 100 placed in series with contact $93n$ drops the battery voltage to the proper value at terminal 98 for the corresponding state of charge indication from the circuit. In the same way, input contacts $94n$ and $94p$ are adapted to contact the negative and positive terminals of AA, C, or D cells, which have a still higher current capacity. A resistor 101 in series with contact $94n$ has a higher resistance value than resistor 100. Input contacts $95n$ and $95p$ are intended for use with a 3.0 volt lithium battery, so series resistor 102 has a still higher value. Finally, contacts $96n$ and $96p$ are adapted for use with a 9 volt cell, so a zener diode 103 having a reverse voltage value of about 7.5 volts is placed in series with contact $96n$. As an example of component values in the input circuit, resistor 72 is 5.6 k$\Omega$, resistor 100 is 7.5 $\Omega$, resistor 101 is 13 $\Omega$, resistor 102 is 220 $\Omega$, and zener diode 103 is a 1N4692 or a 1N5235B. The values of the other components in circuits 61 and 62 are: resistor 73 is 6.8 k$\Omega$, resistor 74 is 150 k$\Omega$, resistor 77 is 82 k$\Omega$, resistor 78 is 12 k$\Omega$, capacitors 68 and 69 are 47 pf, capacitor 70 is 1.0 mf, inductor 71 is 1.0 mh, each of transistors 65, 66, and 79 is an MPS 4123, transistor 67 is a 2N2222, and zener diode 80 is a 1N4686.

The operation of the circuit in FIG. 13 is the same as previously described for the circuit of FIG. 10.

Figure 14:
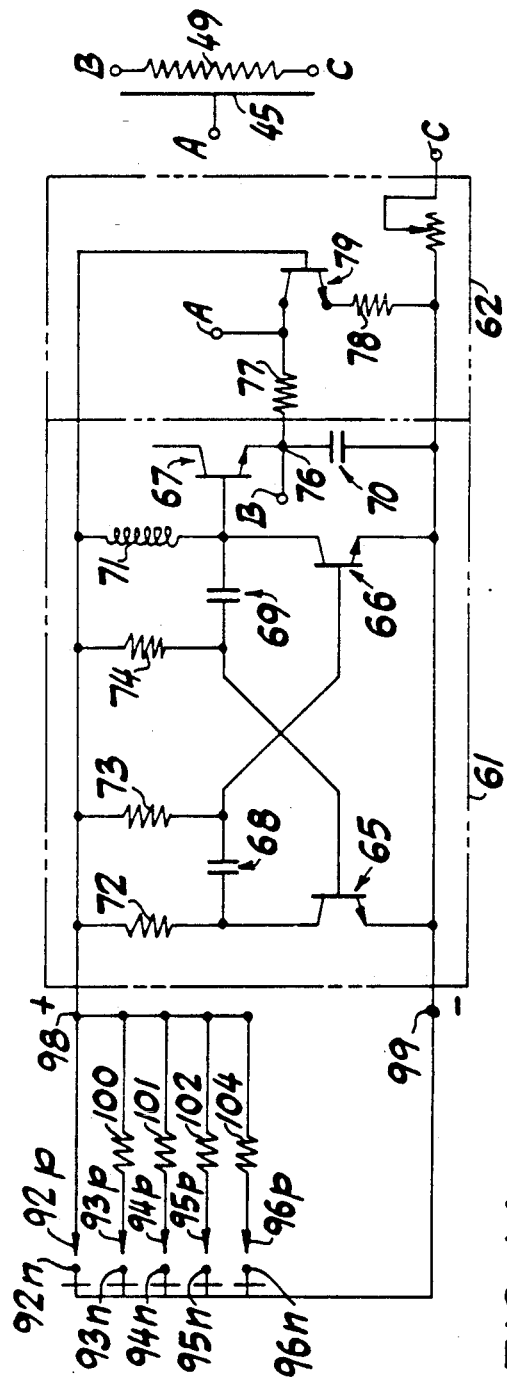
FIG. 14 is an alternative embodiment of the electrical circuit diagram of FIG. 13.

FIG. 14 shows a circuit that is the same as that of FIG. 13 except that a resistor 104 replaces the zener diode 103 in series with contact $96n$, with a resistor $104a$ added as a shunt load across the circuit input junctions 98 and 99, and a potentiometer 105 replaces zener diode 97 to provide a less expensive version of the circuit. Resistors 104 and $104a$ divide the 9 volt battery input at contacts $96n$ and $96p$ so that approximately 1.5 v appears between junctions 98 and 99. Since resistor $104a$ shunts the other contacts as well, the values of resistors 100, 101, and 102 may have to be adjusted from the values used in the circuit of FIG. 13.

FIGS. 15-18 show a preferred arrangement for a battery tester using one of the circuits of FIGS. 13 and 14. FIG. shows the face 106 and FIG. 16 the underside 107 of a molded plastic top shell 108 of a battery tester case. The top shell 108 has a number of recesses of different sizes to accommodate different sized cells for testing. In particular, there is a D-cell recess 109, a C-cell recess 110, an AA-cell recess, an AAA-cell recess 112, a 1.5 volt button cell recess 113, a 3 volt lithium cell recess 114, and two openings 115 and 116 in a recess 117 for receiving the terminals of a 9 volt battery. In addition, the top shell has a rectangular opening 118 that provides a viewing window for a display device (not shown) of the type previously described.

Figure 16:
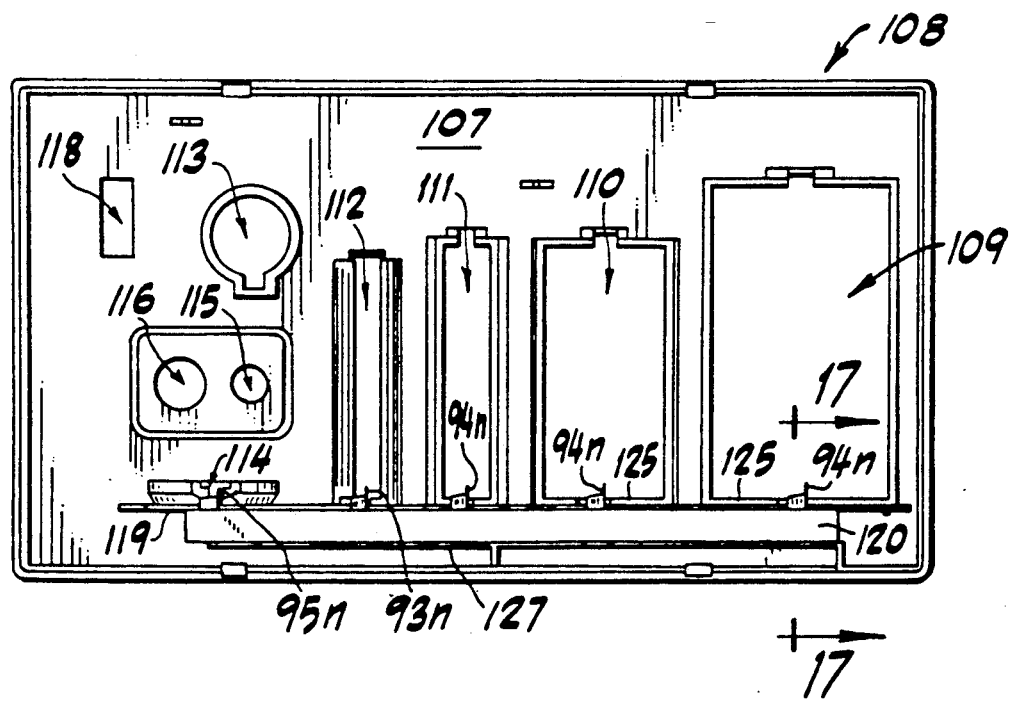
FIG. 16 is a bottom plan view of the top shell half of FIG. 15.

Each cell testing opening has a shape that permits insertion of a cell to be tested in only one orientation. In addition, the D, C, AA, AAA, and lithium cell recesses are arranged so that contacts 93n (AAA cell), 94n (AA, C, and D cells), and 95n (lithium cell) are in a straight line. As shown in FIG. 16, this arrangement permits the use of a single contact strip 119 backed by an elongated plastic foam pad 120 that both holds the contact strip in place and provides a spring biasing force to each contact. The plastic foam spring biasing pad permits quick and easy assembly and allows the use of a single contact strip instead of more costly multiple contacts.

Figure 18:
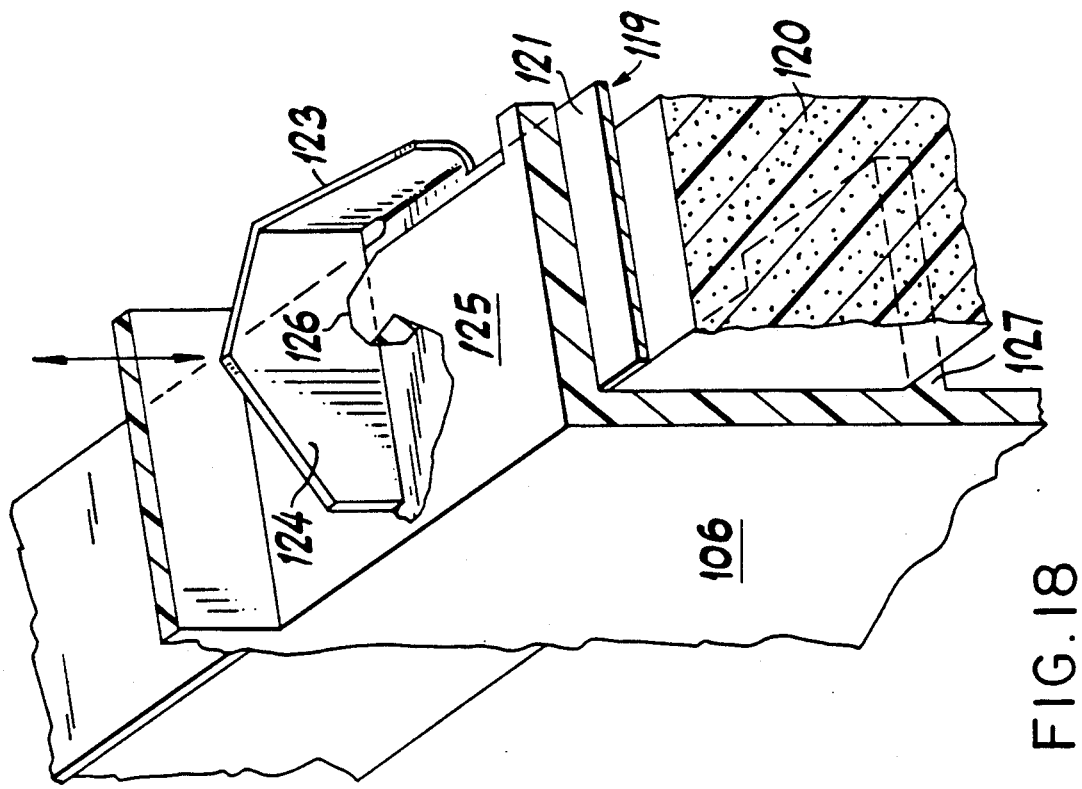
FIG. 18 is a partly broken away perspective view of the portion of the top shell half shown in the section view of FIG. 17.
Figure 15:
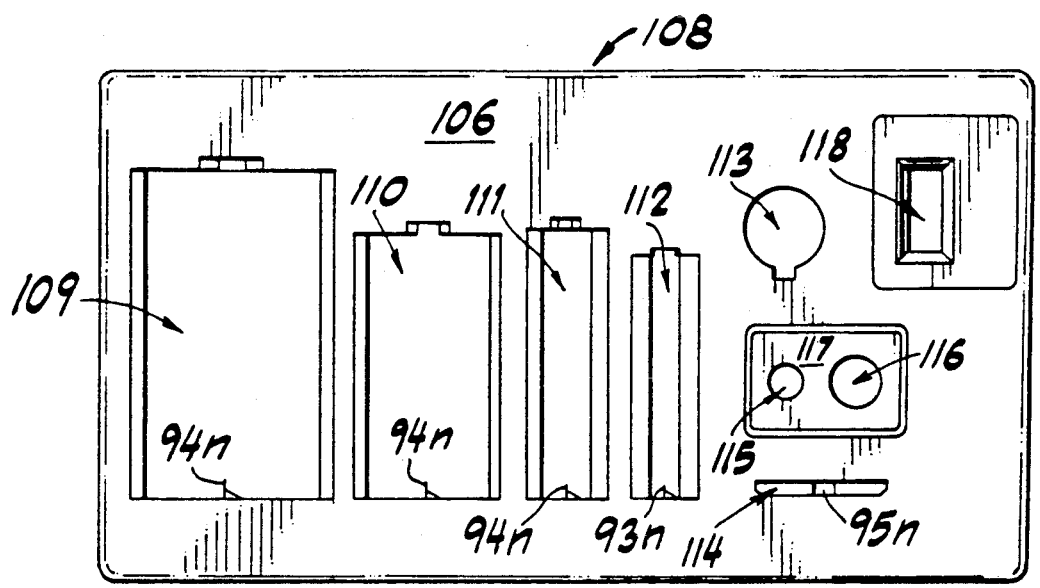
FIG. 15 is a top plan view of a molded plastic top shell half of a housing for a battery tester according to the invention.

As shown in FIGS. 17 and 18, the contact strip 119 can be a phosphor bronze stamping having an elongated rectangular base 121, with each contact being formed from a pentagonal piece 122. The pentagonal piece 122 has an end portion 123, that is connected integrally and is bent at a right angle to the base 121, and a main portion 124, that is bent at a right angle to the end portion 123 so as to extend transversely across the base 121.

The base 121 contact strip 119 is assembled in the top shell 108 against inner faces of lips 125 of defining the aligned edges of the D, C, AA, AAA, and lithium cell test recesses in the top shell. The main portion 124 of each contact slips into a slot-shaped opening 126 in the corresponding lip 125 of each recess. The elongated plastic foam pad then fits snugly between the base of the contact strip and an integrally molded shelf 127 extending parallel to and spaced from the aligned lips 125. As is clear from FIG. 16, pressure exerted on any of the contacts 93n, 94n, or 95n when a corresponding cell is inserted into a respective cell testing recess will cause resilient deformation of the foam pad 120, allowing the contact to make a good electrical connection with the cell being tested.

The contacts for the positive terminals of the D, C, AA, AAA, and lithium cell recesses, as well as both the negative and positive contacts of the button cell and 9 volt battery terminal openings are of conventional design and are not shown in the drawings.

I claim:

1. A device for indicating the state of charge of an electrochemical cell as a function of an output voltage appearing across negative and positive output terminals of the cell, the output voltage lying in a predetermined range and having a predetermined relation to the state of charge of the cell, the device comprising an amplifying circuit having an input to be connected to the negative and positive terminals of a cell of which the state of charge is to be indicated and an output, the amplifying circuit including means for producing a voltage at the output of the amplifying circuit that is a predetermined function of an output voltage of the cell in said predetermined range;

a regulated-voltage generating circuit having an input to be connected to the negative and positive terminals of the cell to be tested and an output, the regulated-voltage generating circuit including means for producing at the output of the regulated-voltage generating circuit a predetermined fixed regulated reference voltage in response to an output voltage of the cell falling within said predetermined range applied to the input of the regulated-voltage generating circuit; and an analog solid state display unit having a first input connected to the output of the amplifying circuit and a second input connected to the output of the reference-voltage generating circuit, the display unit producing a visual analog indication of the state of charge of a cell being tested when an output voltage of the cell falling within said predetermined range is applied to the inputs of the amplifying and regulated-voltage generating circuits.

2. An indicating device according to claim 1 wherein the means of the amplifying circuit for producing a voltage at the output of the amplifying circuit that is a function of the output voltage of the cell comprises means for producing a voltage that is a linear function of the output voltage of the cell when the output voltage of the cell falls within said predetermined range.

3. An indicating device according to claim 2 wherein the voltage produced at the output of the amplifying circuit when the output voltage of a cell connected to the input of the amplifying circuit falls within said predetermined range is not greater than the regulated reference voltage produced at the output of the reference-voltage generating circuit when said cell is connected to the input of the reference-voltage generating circuit.

4. An indicating device according to claim 1 wherein the amplifying circuit comprises:
a transistor having a collector, an emitter, and a control electrode;
a load resistor having a first end connected to one of the collector and emitter of the transistor and a second end connected to the output of the reference-voltage generating circuit; and
a current-limiting resistor having a first end connected to the other of the collector and emitter of the transistor and a second end, the control electrode of the transistor and the second end of the current-limiting resistor being connected to the input of the regulated-voltage generating circuit.

5. An indicating device according to claim 4 wherein the reference-voltage generating circuit comprises first and second transistors connected as a multivibrator, a resistor connected in one of a collector leg and an emitter leg of the first transistor, an inductor connected in one of a collector leg and an emitter leg of the second transistor so that current flows through the inductor when the second transistor is turned on, a storage capacitor connected in circuit with the inductor so as to be charged by the collapsing field of the inductor when the second transistor is shut off, and a combination charging diode and voltage limiting device connected in circuit with the capacitor to limit the charge voltage of the capacitor to the value of the predetermined regulated reference voltage.

6. An indicating device according to claim 5 wherein the combination charging diode and voltage limiting device is a zener-effect element.

7. An indicating device according to claim 6 wherein the zener-effect element is selected from the group consisting of a zener diode and a transistor connected as a diode.

8. An indicating device according to claim 7 wherein the input of the regulated-voltage generating circuit comprises a negative bus and a positive bus, the inductor being connected between one of the collector and emitter of the second transistor and one of the negative and positive buses, a control grid of the zener-effect transistor being connected to the junction between the inductor and the second transistor, one of a collector and emitter of the zener-effect transistor being connected to one side of the capacitor, and the other side of the capacitor being connected to the other of the negative and positive buses.

9. An indicating device according to claim 1 wherein the analog display unit comprises:
- first and second plates, at least one of which is transparent, the plates being spaced apart by a small gap and having respective first and second inner surfaces facing each other across the gap;
- a field-effect visual display dielectric material disposed in the gap between the first and second plates;
- an address electrode disposed on the first inner surface of the first plate, the address electrode being conductively connected to the output of the amplifying circuit; and
- a reference electrode disposed on the second inner surface of the second plate, the reference electrode being conductively connected to the output of the reference-voltage generating circuit.

10. A device according to claim 1 wherein the analog display device comprises:
- first and second plates, at least one of which is transparent, the plates being spaced apart by a small gap and having respective first and second inner surfaces facing each other across the gap;
- a field-effect visual display dielectric material disposed in the gap between the first and second plates;
- a non-resistive address electrode disposed on the first inner surface and having an area corresponding to a preselected area of a visual analog display, the address electrode being conductively connected to the first input of the display unit;
- a series of non-resistive conductor strips disposed in spaced parallel relation on the second inner surface across the area of the analog visual display;
- an elongated resistive element disposed along a side of the second plate perpendicularly to the conductor strips, the resistive element being connected across the second input of the display unit, and the conductor strips being electrically connected to the resistive element at spaced-apart locations along the length of the resistive element, such that each conductor assumes a different incremental voltage when the regulated reference voltage is applied to the second input of the display unit.

11. An indicating device according to claim 10 wherein the field-effect visual display dielectric material requires a minimum actuating voltage for changing from a first visual state to a second visual state such that when the value of an output voltage of the amplifying circuit applied to the first input of the display unit is between the most negative and most positive values of the regulated reference voltage applied to the second input of the display unit, the resulting display shows a bar having the appearance of the first visual state at a region of the display area where the voltages on the conductor strips differ from the output voltage of the amplifying circuit applied to the address electrode by less than the actuating voltage, and the remainder of the display area has the appearance of the second visual state of the field-effect dielectric material.

12. An indicating device according to claim 11 wherein the width of the bar having the appearance of the first visual state is a function of the magnitude of the regulated reference voltage.

13. An indicating device according to claim 1 wherein the means for producing the predetermined regulated reference voltage at the output of the regulated-voltage generating circuit comprises;
- means for converting the output voltage of the cell into a succession of pulses;
- means for shaping each pulse into a high-voltage short duration pulse;
- a storage device;
- means for delivering each shaped pulse to the storage device; and
- means for limiting the voltage of the storage device to the preselected value of the regulated reference device.

14. An indicating device according to claim 13 wherein the means for converting the output voltage of the cell comprises a multivibrator circuit having an input corresponding to the input of the regulated-voltage generating circuit and an output for delivering the succession of pulses; and
- the means for shaping each pulse into a high-voltage short duration pulse comprises an inductor for producing the high-voltage short duration pulses.

15. An indicating device according to claim 1 wherein the analog solid state display unit provides a bar graph presentation.

16. An indicating device according to claim 1 wherein the analog solid state display unit is a liquid crystal display unit.

17. A device for indicating the state of charge of a battery in an apparatus powered by the battery, the device comprising:
- a solid state display unit having a reference voltage input and first and second address inputs, each address input being connected to respective first and second adjacent analog display elements;
- an amplifying circuit having an input and an output, the circuit including means for producing a voltage at the output that has a predetermined characteristic corresponding to values of the battery voltage applied to the input in a preselected range of battery voltages under load that relate directly to the state of charge of the battery;
- an input switch for connecting the input of the amplifying circuit to the battery when the battery is supplying power to the apparatus;
- an output switch for periodically connecting the output of the amplifying circuit alternately to the first and second address inputs when the battery is connected to the input of the amplifying circuit;
- a regulated-voltage generating circuit having an input connected to the battery through the input switch and an output connected to the reference voltage input of the display unit for supplying a reference voltage to both display elements of the display unit when the input of the amplifying circuit is connected to the battery; and means connected between the output of the amplifying circuit and the first display element for storing at least one of the alternately applied output voltages so that the first display element shows a previous value of the state of charge of the battery when the second display element shows a current value of the state of charge of the battery, whereby the difference in displayed values by the two display elements provides an optical indication of the rate of change of the state of charge of the battery.

18. An indicating device according to claim 17 wherein the display unit comprises first and second parallel plates having a gap between them, at least one of the plates being transparent and being subdivided into first and second side-by-side elongated display regions, the first plate having first and second electrically conductive surfaces facing the gap in the respective first and second display regions and being connected to the respective first and second address inputs, and the second plate having first and second electrically nonconductive surfaces facing the gap in the respective first and second display regions; a plurality of conductive elements disposed in predetermined spaced-apart relation on the nonconductive surfaces of the second plate in the first and second display regions; an impedance element connected to the reference voltage input for distributing the reference voltage as a voltage gradient, each of the conductive elements in each display region being connected to the impedance element at a different point of the voltage gradient so that adjacent conductive elements in each display region have incrementally different electrical potentials; and liquid crystal material disposed in the gap between first and second plates in the two display regions.

19. An indicating device according to claim 18 wherein the impedance element comprises an elongated resistive element having a predetermined resistance per unit length in accordance with said voltage gradient.

20. An indicating device according to claim 19 wherein the plurality of conductive elements disposed on the second plate in each display region comprise a plurality of parallel strips extending transversely to the longitudinal dimension of the display region, and the resistive element extends adjacent a corresponding end portion of each of the conductive strips, the end portion of each of the conductive strips being electrically connected in the order of the plurality of strips to different locations disposed along the length of the resistive element.

21. An indicating device according to claim 20 wherein the voltage gradient along the length of the resistive element is a linear gradient.

22. A method for providing an optical presentation of the state of charge of an electrochemical cell on an analog liquid crystal display unit having a pair of plates spaced apart from one another to form a gap therebetween and a liquid crystal material disposed in the gap, at least one of the plates being substantially transparent, and the unit having a reference voltage input and at least one address voltage input, wherein the method comprises:

deriving a reference voltage having a predetermined fixed value from an output voltage of the cell within a preselected range corresponding to a range of charge states to be optically presented on the display unit;

deriving an address voltage from the output voltage of the cell within the preselected range, the value of the address voltage having a predetermined relation to the state of charge corresponding to the output voltage of the cell and falling within the most negative and most positive values of the reference voltage;

applying the reference voltage to the reference voltage input of the display unit; and applying the address voltage to the at least one address input of the display unit so as to cause the liquid crystal material to provide an optical presentation corresponding to the state of charge of the cell.

23. A method according to claim 22 wherein the step of deriving a reference voltage comprises:

converting the output voltage of the cell to a succession of voltage pulses, each pulse having a peak value higher than the output value of the cell;

storing the voltage pulses to provide a source of constant voltage; and limiting the value of the stored constant voltage to the predetermined value of the reference voltage.

24. A method according to claim 22 wherein the step of deriving an address voltage comprises amplifying the output voltage of the cell by a preselected factor depending on the selected magnitude of and the most negative and most positive values of the reference voltage.

25. A method according to claim 22 wherein the display unit has first and second display regions and first and second address inputs, one to each display region, and wherein the step of applying the address voltage to the at least one address input comprises periodically sampling an instantaneous value of the address voltage; alternately storing a sampled address voltage and applying a sampled address voltage to one of the first and second address inputs; and periodically applying at least one previously stored sampled address voltage to the other of the first and second address inputs, such that the one of the first and second display regions shows a periodically updated instantaneous state of charge of the cell, the other of the first and second display regions shows a previous value of the state of charge, and the difference between the two displays is an indication of the rate of change of the state of charge.

* * * * *